United States Patent [19]
Yao et al.

[11] Patent Number: 6,026,589
[45] Date of Patent: Feb. 22, 2000

[54] WAFER CARRIER AND SEMICONDUCTOR APPARATUS FOR PROCESSING A SEMICONDUCTOR SUBSTRATE

[75] Inventors: Jack Chihchieh Yao, Scotts Valley; Robert Jeffrey Bailey, Santa Cruz, both of Calif.

[73] Assignee: Silicon Valley Group, Thermal Systems LLC, Scotts Valley, Calif.

[21] Appl. No.: 09/018,021

[22] Filed: Feb. 2, 1998

[51] Int. Cl.[7] .................................................. F26B 21/06
[52] U.S. Cl. ................................. 34/78; 34/228; 34/229
[58] Field of Search .............................. 34/406, 58, 77, 34/78, 92, 228, 229; 414/207, 217, 222, 225, 226, 331, 416, 939, 940; 118/715, 718, 719, 725

[56] References Cited

U.S. PATENT DOCUMENTS

| | | | |
|---|---|---|---|
| 4,907,931 | 3/1990 | Mallory et al. | 414/225 |
| 5,314,509 | 5/1994 | Kato et al. | 34/406 |
| 5,349,762 | 9/1994 | Kato et al. | 34/406 |
| 5,369,891 | 12/1994 | Kamikawa | 34/78 |
| 5,457,896 | 10/1995 | Kato et al. | 34/406 |
| 5,553,396 | 9/1996 | Kato et al. | 34/406 |
| 5,556,147 | 9/1996 | Somekh et al. | 294/64.1 |
| 5,643,366 | 7/1997 | Somekh et al. | 118/721 |
| 5,645,646 | 7/1997 | Beinglass et al. | 118/730 |
| 5,656,093 | 8/1997 | Burkhart et al. | 118/728 |
| 5,657,553 | 8/1997 | Tarui et al. | 34/78 |
| 5,661,913 | 9/1997 | Kato et al. | 34/406 |
| 5,667,592 | 9/1997 | Boitnott et al. | 118/719 |
| 5,784,799 | 7/1998 | Kato et al. | 34/92 |
| 5,863,170 | 1/1999 | Boitnott et al. | 414/222 |

*Primary Examiner*—Stephen Gravini
*Attorney, Agent, or Firm*—Flehr Hohbach Test Albritton & Herbert LLP

[57] ABSTRACT

A wafer carrier is provided comprised of a circular plate having a flat edge region extending around the circumference of the plate. The plate has a circular recessed center region with a recessed bottom surface and includes an upwardly inclined surface around the periphery of the recessed bottom surface. A substrate is placed in the center region where it is supported by a portion of the upwardly inclined surface and is spaced apart form the recessed bottom surface such that the substrate is supported only around its edge. The wafer carrier minimizes surface contact with the substrate thereby minimizing metal contamination and surface damage to the backside of a substrate and prevents deposition on the backside of the substrate.

11 Claims, 3 Drawing Sheets

WAFER CARRIER AND SEMICONDUCTOR APPARATUS FOR PROCESSING A SEMICONDUCTOR SUBSTRATE

The invention relates generally to the field of semiconductor processing and more specifically to a wafer carrier and semiconductor apparatus for processing a semiconductor substrate which minimizes contact with the backside of the substrate.

BACKGROUND OF THE INVENTION

In the manufacture of semiconductors and integrated circuits, various films or layers of materials are deposited during the fabrication of such circuits. Dielectric films are widely deposited on semiconductor wafers to electrically isolate conductive layers and enable useful interconnects between such layers. Dielectrics, and other films, are often formed by chemical vapor deposition (CVD). The CVD process deposits a material on a surface of a substrate by transport and reaction of certain gaseous precursors on the surface. CVD reactors come in many forms. Low pressure CVD systems (LPCVD) and atmospheric pressure CVD systems (APCVD) operate on thermal CVD principles. Plasma may be employed to assist decomposition of chemicals for reaction in plasma enhanced CVD systems (PECVD), and in high density plasma (HDP) systems.

Since CVD deposits the components of the precursor chemicals, it is important to minimize contaminants in the CVD reactor environment because such contaminants may become deposited in the film. Contaminants in the film damage the function of the devices on the wafer and reduce the device yields. Metal contamination is especially detrimental on silicon wafers because the metal impurities can alter the properties of the wafer and devices after thermal processing and affect gate oxides.

Contaminants can arise from many sources. In addition to the presence of impurities in the precursor chemicals, contaminants can arise from the CVD systems themselves. During semiconductor processing metal atom contaminants may arise from some of the metal components making up the processing equipment. Such contaminants may be delivered to the semiconductor substrates where they contaminate the substrate surfaces and/or deposit in the film.

One source of metal contamination is the wafer support. In conventional systems, the wafer is typically in contact with the wafer support. During processing, contamination of the wafer can occur from the support. Additionally, contact with the wafer support can damage the backside surface of the wafer. This presents a problem when thin films are later deposited on the backside of the wafer. Scratches caused by contact with the wafer support can create defects in the films.

Moreover, for certain applications (called backseal applications) it is important that no deposition occur on the backside of the wafer during deposition on the front side of the wafer. Thus, not only is it important to minimize contact with the wafer for minimizing contamination and scratches on the wafer, it is at times important to seal the wafer from the deposition gases.

Prior art wafer carriers typically support the wafer by contacting a substantial area of the backside of the wafer. Such surface contact with the wafer promotes metal contamination and damaging of the backside surface. Another prior art wafer carrier, as described in U.S. Pat. No. 5,645,646, employs a plurality of support plates projecting from the surface of a plate to support the wafer. This design suffers from the same limitations, by providing surface contact with the wafer at a variety of locations. Moreover, this design allows deposition on the backside of the wafer and thus would not be suitable for backseal applications. It is desirable to provide a wafer support than minimizes surface contact with the substrate and is also capable of preventing deposition on the backside of the wafer.

OBJECTS AND SUMMARY OF THE INVENTION

Accordingly, it is an object of the present invention to provide an improved wafer carrier.

More particularly, it is an object of the present invention to provide a wafer carrier that minimizes surface contact with a substrate thereby minimizing metal contamination and surface damage to the backside of a substrate.

It is a further object of the present invention to provide a wafer carrier that prevents deposition on the backside of a substrate.

A related object of the present invention is to provide a wafer carrier that promotes uniform deposition on the topside of a substrate.

These and other objects and advantages are achieved by the wafer carrier of the invention disclosed herein. The wafer carrier includes a circular plate having a flat edge region extending around the circumference of the plate. The plate has a circular recessed center region with a recessed bottom surface and includes an upwardly inclined surface around the periphery of the recessed bottom surface. A substrate (also referred to as a "wafer") is placed in the center region where it is supported by a portion of the upwardly inclined surface and is spaced apart from the recessed bottom surface such that the substrate is supported by the wafer carrier only around its peripheral edge.

BRIEF DESCRIPTION OF THE DRAWINGS

Other objects and advantages of the present invention become apparent upon reading of the detailed description of the invention provided below and upon reference to the drawings in which.

DETAILED DESCRIPTION OF THE INVENTION

Figure 1:
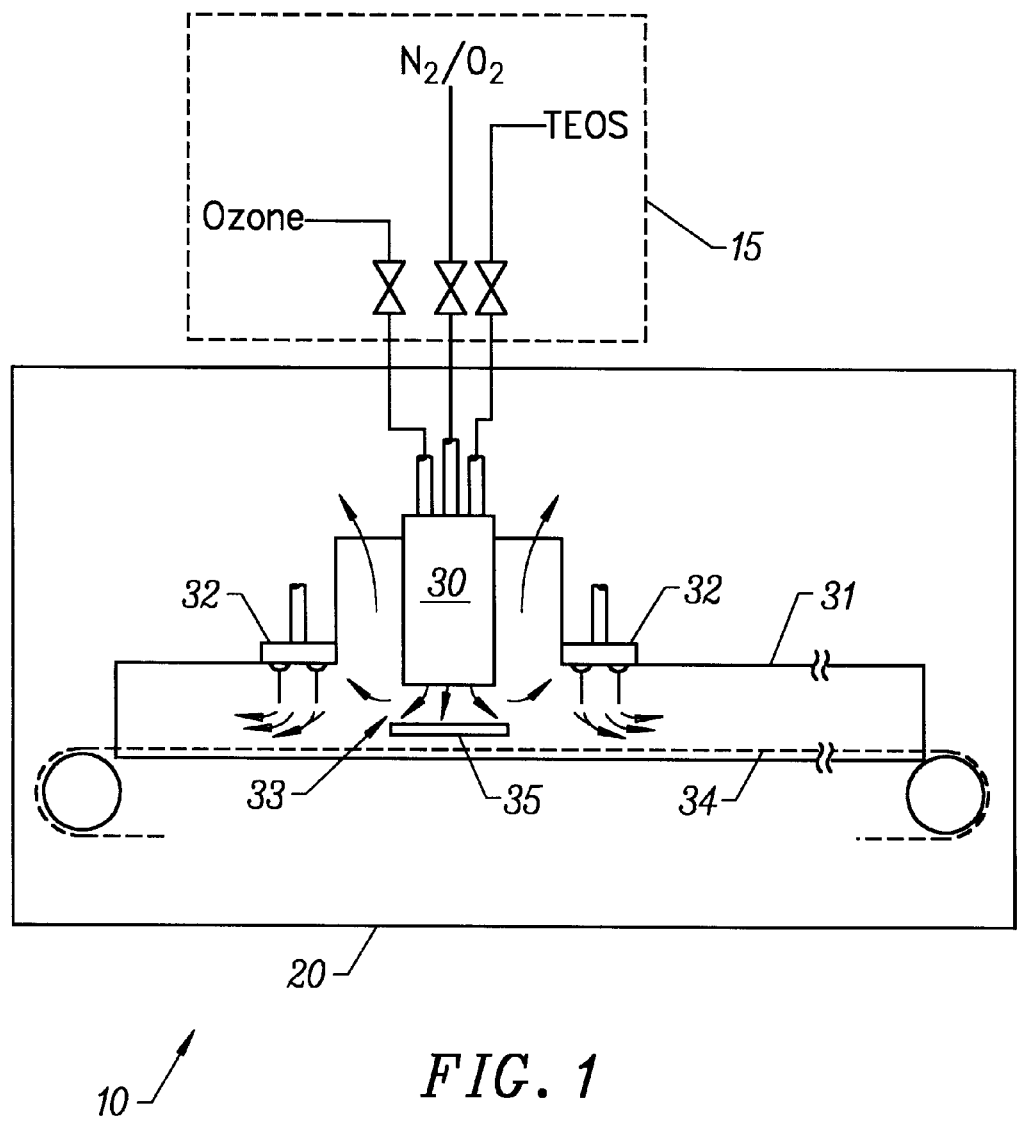
FIG. 1 is a partial schematic view, partially in cross-section, of a chemical vapor deposition (CVD) system apparatus which may be employed with the present invention in accordance with one embodiment.

Turning to the drawings, wherein like components are designated by like reference numerals, FIG. 1 shows a schematic representation of an apparatus that can employ the wafer carrier of the present invention. FIG. 1 depicts a chemical vapor deposition (CVD) system 10 which generally includes a CVD reactor 20 and a gas delivery system 15 having conduits for delivery of gases to the reactor 20. CVD reactor 20 is shown as a conveyorized atmospheric pressure CVD (APCVD) type reactor, which is more fully descried in U.S. Pat. No. 4,834,020 and is herein incorporated by reference. It is important to note that although an APCVD reactor is shown, the inventive method may be practiced using other types of CVD reactors such as low pressure CVD (LPCVD), plasma enhanced CVD (PECVD) reactors, and high density plasma (HDP) reactors. The APCVD reactor 20 shown in FIG. 1 typically includes a muffle 31, a plurality of injectors 30 defining multiple stages (for simplicity only one injector 30, and thus one stage is shown) and a conveyor belt 34. The reactor 20 may comprise four stages, each of which are substantially identical. Within the muffle 31, a plurality of curtains 32 are placed around both sides of the injector 30 to isolate an area, and therebetween forming a deposition chamber area 33.

To deposit a film of material on the surface of a semiconductor device, a substrate 35 is placed on the conveyor belt 34 and is delivered into the muffle 31 and through the deposition chamber area 33. In the deposition chamber area 33, gaseous chemicals are conveyed by the injector 30 to the area proximate the surface of the substrate 35, wherein the gaseous chemicals react and deposit a film of material on the surface of the substrate 35.

In order to deposit layers of a desired composition and purity on the surface of the substrate 35, it is important that the wafer support secure the substrate without contaminating and/or damaging the surfaces of the substrate. The present invention promotes the reduction of contaminates and physical damage on the surface of the substrate by supporting the substrate at its peripheral edge. According to one embodiment of the present invention, the substrate is placed in the wafer carrier and the wafer carrier is placed on the conveyor belt 34, which is then delivered to through the deposition chamber 33. In this particular example, a conveyorized type CVD reactor is shown. It should be understood, that a single wafer system where a single wafer is moved in and out of a single reactor chamber, may also be employed with the wafer carrier of the present invention.

Figure 2:
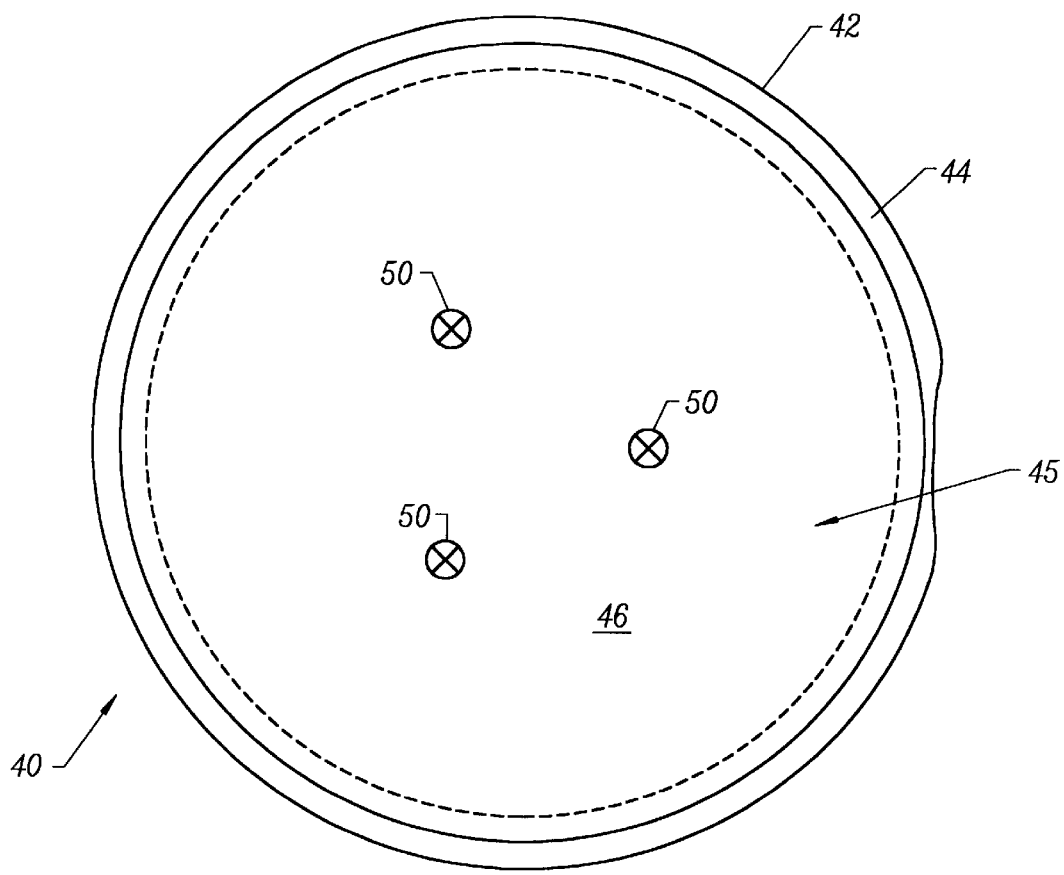
FIG. 2 is a top view of a wafer carrier in accordance with one embodiment of the present invention.
Figure 3:
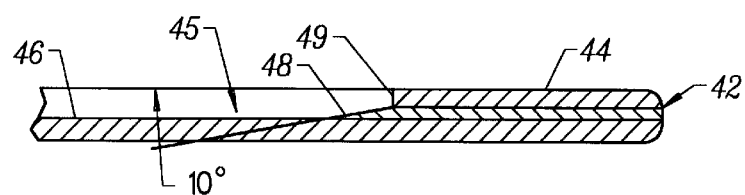
FIG. 3 is a cross-sectional side view of a portion of the wafer carrier in accordance with the present invention.

The wafer carrier is shown in more detail with reference to FIGS. 2 and 3. The wafer carrier 40 comprises a circular plate 42 having a flat edge region 44 extending around the circumference of the plate 42, and a circular recessed center region 45. The recessed center region 45 comprises a recessed bottom surface 46 and an upwardly inclined surface 48 around the periphery of the recessed bottom surface 46. The edge region 49 of the recessed center 45 is perpendicular to the plane of the recessed bottom surface 46. Preferably, although it is not necessary, at least one opening 50 is provided in the bottom surface 46 of the circular recessed region 45. The opening receives a pin (not shown) which engages the wafer to receive and remove the wafer from the wafer carrier.

Figure 4:
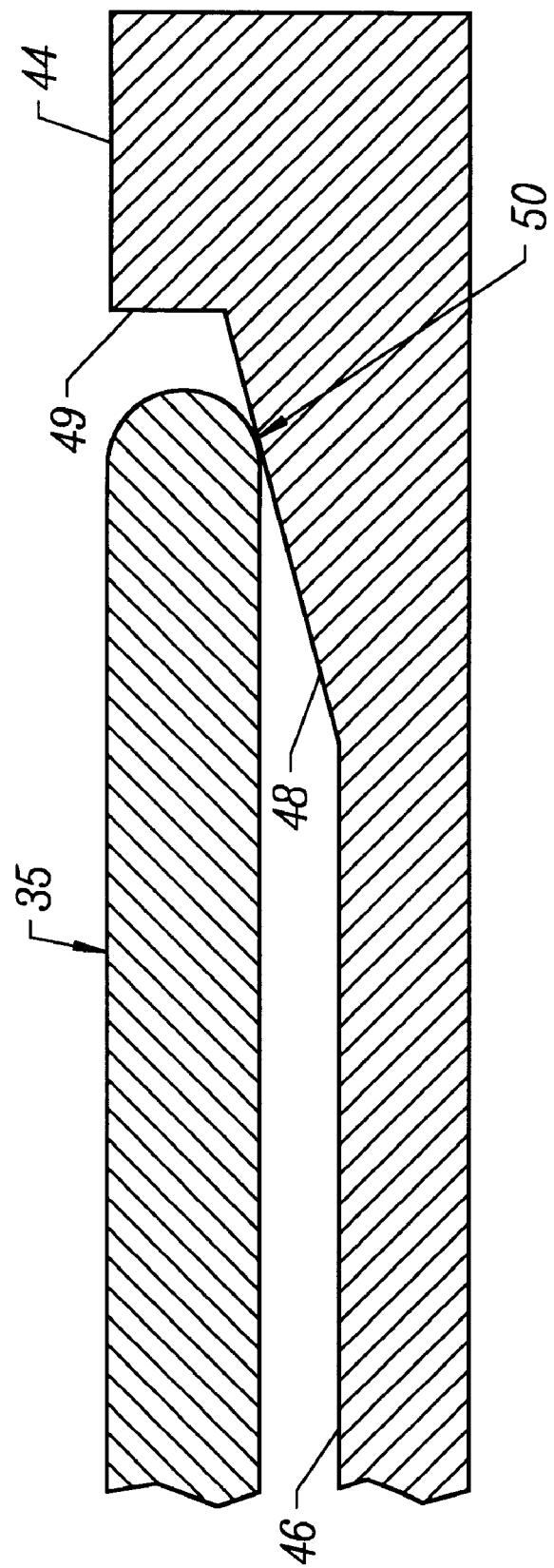
FIG. 4 is an enlarged cross-sectional side view of a portion of the wafer carrier showing placement of a wafer in accordance with the present invention

To support a substrate or wafer, the substrate is placed in the recessed center region 45 as shown in FIG. 4. Of particular advantage the wafer carrier of the present invention provides for supporting the wafer only around its peripheral edge. Specifically, the substrate is placed in the center region and is supported around its periphery by a portion of the upwardly inclined surface 48. The sole contact between the wafer and wafer carrier occurs on the inclined surface, where the curved surface of the wafer edge rests on the carrier. The rest of the wafer backside surface (that is the rest of the wafer besides its peripheral edge) is spaced apart from the bottom surface 46 and thus is not in contact with the wafer carrier. In an alternative embodiment, it is also possible that the inclined surface only extends along a radial distance sufficient to ensure contact with the wafer with a vertical step to the bottom of the carrier.

Preferably, the edge region 49 has a depth that is substantially the same as the thickness of the wafer "t" such that when the wafer is placed in the wafer carrier and contacts a portion of the upwardly inclined surface 48, the top surface of the wafer is substantially flush with the flat edge surface 44 of the wafer carrier. This enhances deposition on the wafer by addressing what is known as the "edge effect." The edge effect is a phenomenon where the edge of the wafer creates disturbances in gas flow and/or temperature uniformity which reduce the uniformity of the deposited film. The edge effect is further minimized by the wafer carrier of the present invention, by effectively extending the edge of the wafer by the flat edge region 44. The edge effect now takes place over the flat edge region 44, leaving uniform deposition to occur along the entire surface of the wafer.

Of particular advantage, as shown in FIG. 4 the wafer contacts the wafer support only along the periphery of the wafer edge 50 where the wafer is supported by the inclined surface 48 of the recessed center 45. The point, or line contact, minimizes contact with the wafer in contrast to the surface contact made in the prior art carriers. By minimizing the surface contact, the present invention, the potential for surface damage and metal contamination is substantially reduced. Of further advantage, the prevent invention substantially eliminates the occurrence of deposition on the backside surface of the wafer. Since the wafer is supported around its entire periphery edge, the wafer is effected sealed and deposition gases do not migrate to the backside of the wafer. This allows the processing of wafers in backseal applications. Again, this is in great contrast to prior art carriers which allow backside deposition to occur.

The wafer carrier can accommodate substrates of various sizes. Preferably, the wafer carrier will have a circular center region 45 with a diameter of approximately 200 mm or 300 mm, to accommodate a 200 or 300 mm wafer, respectively. However, the diameter of the center recessed region can be any size. The edge region 49 of the recessed center 45 will preferably coincide with the thickness of the wafer to be supported. For example, the edge region 49 will have a depth of approximately 0.75 to 0.80 mm for a 300 mm wafer.

Preferably, to support the wafer the upwardly inclined surface 48 is inclined at an angle chosen to minimize contact with the surface of the backside of the wafer. The backside edge surface 50 of the wafer is curved with a roughly semicircular cross-section. The present invention provides for an inclined contact surface that contacts the wafer only on the curved wafer edge 50 and approaches line contact with the wafer around its perirneter. Preferably, the upwardly inclined surface 48 is inclined at an angle in the range of approximately 5 to 45 degrees to the plane of the bottom recessed surface 46, with an angle of approximately 10 degrees being the most preferred.

To maintain the desirable line or point contact with the peripheral edge of the wafer and to provide secure support of the wafer, the thermal expansion of the wafer carrier is considered. Preferably, little thermal expansion occurs during the process so that the desired angle of the incline is preserved. Specifically, the wafer carrier is comprised of a material having a coefficient of thermal expansion in the range of $2.6 \times 10^{-6}/°$ C. to $5 \times 10^{6}/°$ C., with the lower values preferred. Materials with suitable coefficients of thermal expansion include silicon and silicon carbide.

Supporting the wafer by a portion of the upwardly tapered edge region 48 allows the wafer to be spaced apart from the bottom surface 46 of the circular center recessed region 45. The present invention provides for spacing the wafer from contact with the wafer carrier, thereby minimizing surface damage and metal contamination to the wafer, but while maintaining heat transfer to the wafer. To promote heat transfer to the wafer, the thermal conductivity of the wafer carrier is considered. Preferably, the thermal conductivity of the wafer carrier is in the range of approximately 40 to 70 W/m/K to promote good heat transfer. To meet both the coefficient of thermal expansion and thermal conductivity requirements, the wafer carrier is preferably made of a material selected from silicon carbide, aluminum nitride, large-grained polycrystalline silicon, and silicon/silicon carbide alloy.

The inventors have found that the spacing between the backside surface of the wafer and the bottom recessed surface 46 is important for a variety of reasons. First, the spacing's effect on heat transfer must be considered. Second, wafer deflection due to weight, temperature gradients and handling must be evaluated. These criteria are met with the present invention by providing a spacing between the backside surface of the wafer and the bottom recessed surface 46 that is in the range of approximately 0.15 to 0.5 mm, with a spacing of 0.25 mm being the most preferred for 300 mm wafers.

Thus, an improved wafer carrier has been provided. The wafer carrier minimizes metal contamination and damage to the substrate and is suitable for backseal applications. Experiments run with the wafer carrier of the present invention demonstrate that the metal contamination in the films deposited on the wafer is reduced to nondetectable levers ($<10^9$ atoms/cm$^2$).

The foregoing description of specific embodiments of the invention have been presented for the purpose of illustration and description. They are not intended to be exhaustive or to limit the invention to the precise forms disclosed, and obviously many modifications, embodiments, and variations are possible in light of the above teaching. It is intended that the scope of the invention be defined by the claims appended hereto and their equivalents.

What is claimed:

1. A reactor for depositing a layer of material on a substrate, comprising:

a deposition chamber;

a wafer carrier in the deposition chamber, the wafer carrier having a circular plate with a flat edge region extending around the circumference of said plate, and a circular recessed center region having a recessed bottom surface and an upwardly inclined surface around the periphery of said recessed bottom surface, wherein the substrate is supported by a portion of the upwardly inclined surface and is spaced apart from said recessed bottom surface such that the substrate is supported by and in contact with said wafer carrier only around the substantial peripheral edge of the substrate;

a gas inlet into the deposition chamber for conveying gases to the chamber; and an exhaust system for removing gases from the chamber.

2. The reactor of claim 1 wherein said reactor is a low pressure CVD reactor.

3. The reactor of claim 1 wherein said reactor is a atmospheric pressure CVD reactor.

4. The reactor of claim 1 wherein said reactor is a plasma enhanced CVD reactor.

5. A CVD processing apparatus for processing a substrate, comprising:

a muffle;

at least one CVD chamber area within said muffle;

at least one injector for conveying gases into said at least one CVD chamber area;

a conveyorized belt passing through said chamber area and said muffle; and at least one wafer carrier placed on said conveyorized belt for moving the substrate though said chamber area whereby the gases process a surface of the substrate.

6. The CVD processing apparatus of claim 5 wherein said wafer carrier further comprises:

a circular plate having a flat edge region extending around the circumference of said plate; and a circular recessed center region having a recessed bottom surface and including an upwardly inclined surface around the periphery of said recessed bottom surface, wherein the substrate is supported by a portion of the upwardly inclined surface and is spaced apart from said recessed bottom surface such that the substrate is supported by and in contact with said wafer carrier only around the substantial peripheral edge of the substrate.

7. The cvd processing apparatus of claim 6 wherein said upwardly inclined surface of said wafer carrier is inclined at an angle of approximately 10° to the plane of the recessed bottom surface.

8. The cvd processing apparatus of claim 5 wherein said wafer carrier is comprised of a material having coefficient of thermal expansion in the range of $2.6 \times 10^{-6}$ to $5 \times 10^{-6}/°$ C.

9. The cvd processing apparatus of claim 5 wherein said wafer carrier is comprised of a material having thermal conductivity in the range of 40 to 70 W/m/K.

10. The cvd processing apparatus of claim 5 wherein said wafer carrier is comprised of a material selected from the group of silicon carbide, aluminum nitride, large-grained polycrystalline silicon and silicon/silicon carbide alloy.

11. The cvd processing apparatus of claim 5 wherein the wafer is spaced apart from said recessed bottom surface by a distance of approximately 0.15 to 0.5 mm.

* * * * *